US011350540B2

(12) United States Patent
Wu et al.

(10) Patent No.: US 11,350,540 B2
(45) Date of Patent: May 31, 2022

(54) NON-PERMANENT BRACKET ASSEMBLY FOR SERVER CABINET

(71) Applicant: Fulian Precision Electronics (Tianjin) Co., LTD., Tianjin (CN)

(72) Inventors: Chang-Ju Wu, New Taipei (TW); Chen-Sheng Tang, New Taipei (TW)

(73) Assignee: Fulian Precision Electronics (Tianjin) Co., LTD., Tianjin (CN)

(*) Notice: Subject to any disclaimer, the term of this patent is extended or adjusted under 35 U.S.C. 154(b) by 109 days.

(21) Appl. No.: 16/847,580

(22) Filed: Apr. 13, 2020

(65) Prior Publication Data

US 2021/0176887 A1 Jun. 10, 2021

(30) Foreign Application Priority Data

Dec. 10, 2019 (CN) .......................... 201911260184.4

(51) Int. Cl.
*H05K 7/14* (2006.01)

(52) U.S. Cl.
CPC .................. *H05K 7/1489* (2013.01)

(58) Field of Classification Search
CPC .............................. H05K 7/1489; A47B 88/43
See application file for complete search history.

(56) References Cited

U.S. PATENT DOCUMENTS

| 7,520,577 | B2* | 4/2009 | Chen | A47B 88/493 |
| | | | | 312/333 |
| 7,744,177 | B2* | 6/2010 | Peng | H05K 7/183 |
| | | | | 312/334.4 |
| 7,798,581 | B2* | 9/2010 | Chen | H05K 7/1489 |
| | | | | 312/265.1 |
| 8,047,620 | B2* | 11/2011 | Yu | H05K 7/1489 |
| | | | | 312/333 |
| 8,727,138 | B2* | 5/2014 | Dittus | H05K 7/1489 |
| | | | | 211/26 |
| 10,172,254 | B2* | 1/2019 | Lee | E05B 65/46 |
| 10,356,938 | B1* | 7/2019 | Hsu | H05K 5/0204 |
| 10,413,066 | B2* | 9/2019 | Chen | A47B 88/40 |
| 2002/0084734 | A1 | 7/2002 | Shih | |
| 2008/0303390 | A1* | 12/2008 | Hsiung | H05K 7/1489 |
| | | | | 312/223.1 |
| 2010/0007255 | A1* | 1/2010 | Cheng | H05K 7/1489 |
| | | | | 312/334.44 |
| 2012/0086319 | A1* | 4/2012 | Sun | H05K 7/1489 |
| | | | | 312/324 |

(Continued)

FOREIGN PATENT DOCUMENTS

| CN | 204206649 U | 3/2015 |
| CN | 207201159 U | 4/2018 |

(Continued)

*Primary Examiner* — Eret C McNichols
(74) *Attorney, Agent, or Firm* — ScienBiziP, P.C.

(57) ABSTRACT

A non-permanent bracket assembly for a server cabinet which can hold a server only or a server and a power distribution unit includes a slide member and a fixing member. One end of the slide member can be mounted to a cabinet for supporting a server. The fixing member is detachably positioned at the other end of the slide member. The other end of the slide member is mounted to the cabinet through the fixing member, and the fixing member is further configured to fix a power distribution unit.

13 Claims, 8 Drawing Sheets

(56) References Cited

U.S. PATENT DOCUMENTS

| | | | |
|---|---|---|---|
| 2013/0058596 A1* | 3/2013 | Chen | H05K 7/1489 384/7 |
| 2014/0265788 A1* | 9/2014 | Judge | H05K 7/1489 312/334.1 |
| 2015/0048041 A1* | 2/2015 | Chuang | H05K 7/1489 211/175 |
| 2015/0084494 A1* | 3/2015 | Tonthat | A47B 88/43 312/333 |
| 2015/0216071 A1* | 7/2015 | Fan | H05K 7/1489 384/21 |
| 2016/0296016 A1* | 10/2016 | Chen | H05K 7/1489 |
| 2017/0079427 A1* | 3/2017 | Chen | H05K 7/1489 |
| 2017/0303426 A1* | 10/2017 | Chen | A47B 96/07 |
| 2018/0116068 A1* | 4/2018 | Lee | H05K 7/1489 |
| 2018/0125234 A1* | 5/2018 | Chen | A47B 88/43 |
| 2018/0220797 A1* | 8/2018 | Chen | A47B 88/423 |
| 2018/0242472 A1* | 8/2018 | Wu | H05K 7/1487 |
| 2020/0077793 A1* | 3/2020 | Chen | H05K 7/1489 |
| 2020/0344907 A1* | 10/2020 | Tower | H05K 7/1489 |

FOREIGN PATENT DOCUMENTS

| | | | | |
|---|---|---|---|---|
| EP | 3478042 A1 * | 5/2019 | | H05K 7/1489 |
| TW | 201737012 A | 10/2017 | | |
| TW | I670030 B | 9/2019 | | |

* cited by examiner

NON-PERMANENT BRACKET ASSEMBLY FOR SERVER CABINET

FIELD

The subject matter herein generally relates to servers, and in particular to a bracket assembly for fixing a power distribution unit (PDU) and supporting a server.

BACKGROUND

Generally, fixing assemblies or sliding rails are used for installing PDUs on a bracket of a server. However, the fixing assemblies only have a function for fixing the PDUs and have no function in supporting future maintenance of the server. The sliding rails are integrally formed, and if the server is not installed in remaining locations of the sliding rails, the sliding rails are redundant and occupy space.

Therefore, there is room for improvement within the art.

BRIEF DESCRIPTION OF THE DRAWINGS

Many aspects of the disclosure can be better understood with reference to the figure. The components in the figures are not necessarily drawn to scale, the emphasis instead being placed upon clearly illustrating the principles of the disclosure.

DETAILED DESCRIPTION

Figure 1:
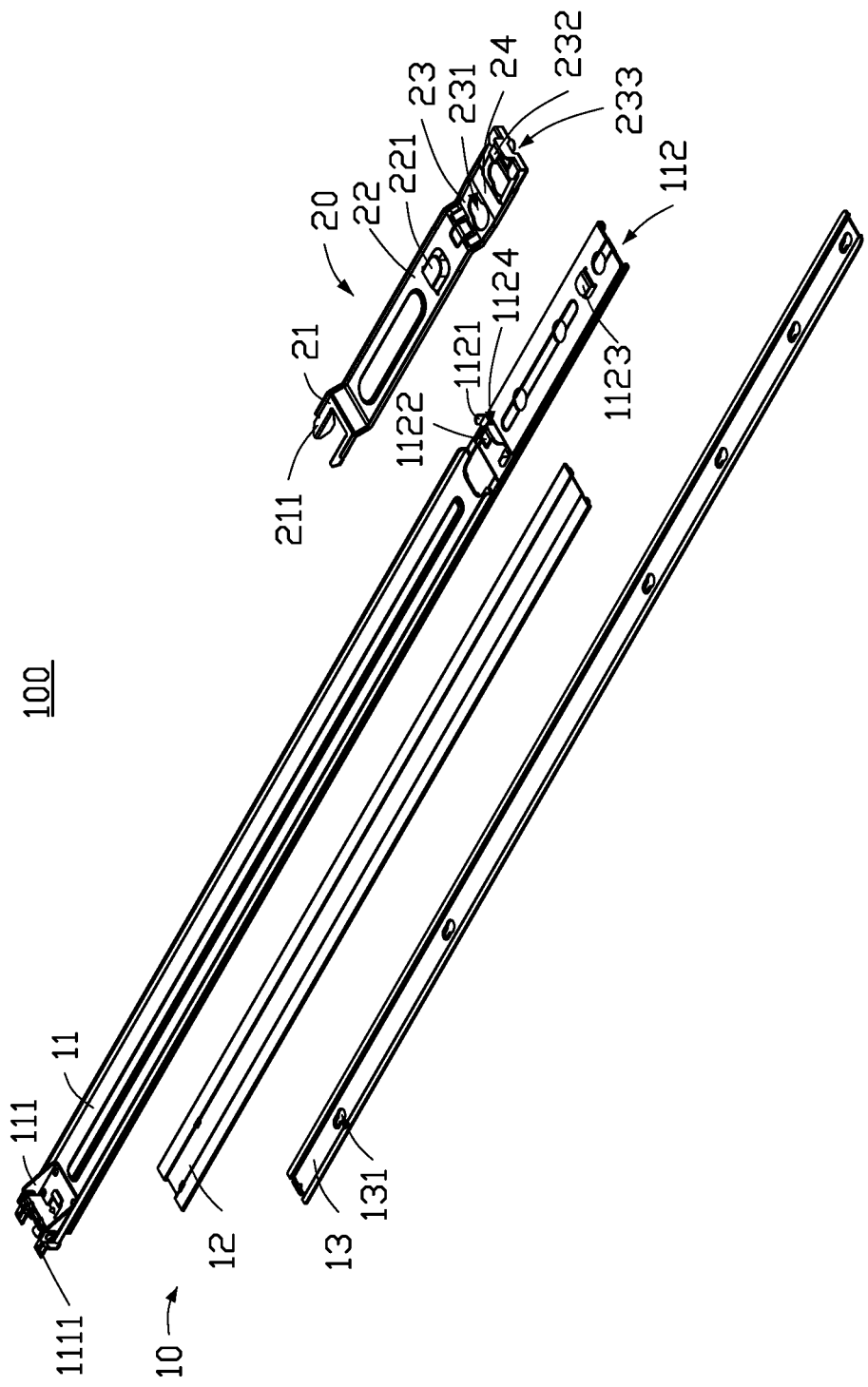
FIG. 1 is an exploded, isometric view of a bracket assembly according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates a bracket assembly 100 according to an embodiment of the present disclosure. The bracket assembly 100 includes a slide member 10 and a fixing member 20. In this embodiment, the slide member 10 is a slide member. One end of the slide member 10 can be mounted on a cabinet 400 (shown in FIG. 8) to support a server 200 (shown in FIG. 7) on the cabinet 400. The fixing member 20 is detachably positioned at the other end of the slide member 10 and configured to carry a power distribution unit (PDU) 300 (shown in FIG. 5).

In this embodiment, the slide member 10 includes a mounting portion 11, a first sliding portion 12, and a second sliding portion 13.

The mounting portion 11 is substantially a strip structure. One end of the mounting portion 11 can be installed on the cabinet 400. A first plug-in portion 111 is positioned at one end of the mounting portion 11. The first plug-in portion 111 includes two first plug-in posts 1111. The two first plug-in posts 1111 protrude at one end of the first plug-in portion 111 and are spaced apart from each other. The two first plug-in posts 1111 can be plugged into the cabinet 400 and then the one end of the slide member 10 is plugged into the cabinet 400.

Another end of the mounting portion 11 includes a fixing portion 112. The fixing portion 112 is substantially plate-shaped. The fixing portion 112 includes two second plug-in posts 1121, a bending portion 1122, and a latching portion 1123. The two second plug-in posts 1121 are spaced apart from each other and protrude from one end of the fixing portion 112. The bending portion 1122 is substantially L-shaped. The bending portion 1122 is positioned between the two second plug-in posts 1121. The two second plug-in posts 1121 and the bending portion 1122 cooperatively form a notch 1124. That is, the two second plug-in posts 1121 and the bending portion 1122 can cooperate to embed one end of the fixing member 20 in the notch 1124. In this embodiment, the two second plug-in posts 1121 are also used to be plugged into the cabinet 400, so that the other end of the slide member 10 is installed to the cabinet 400.

The latching portion 1123 is positioned at an end of the fixing portion 112 away from the two second plug-in posts 1121. In this embodiment, the latching portion 1123 may be a buckle. The latching portion 1123 is configured to engage with the fixing member 20.

In this embodiment, the first sliding portion 12 is substantially a sliding-groove structure. The first sliding portion 12 is positioned at one side of the mounting portion 11 and slidable relative to the mounting portion 11.

In this embodiment, the second sliding portion 13 is substantially a sliding-groove structure. The second sliding portion 13 is positioned at a side of the first sliding portion 12 away from the mounting portion 11 and slidable relative to the first sliding portion 12. In this embodiment, the second sliding portion 13 is longer than the first sliding portion 12.

In this embodiment, the second sliding portion 13 defines a latching hole 131 into which a matching hook (not shown) of the server 200 can be inserted. Then, the server 200 is mounted on the second sliding portion 13 and the slide member 10 supports the server 200.

Figure 2:
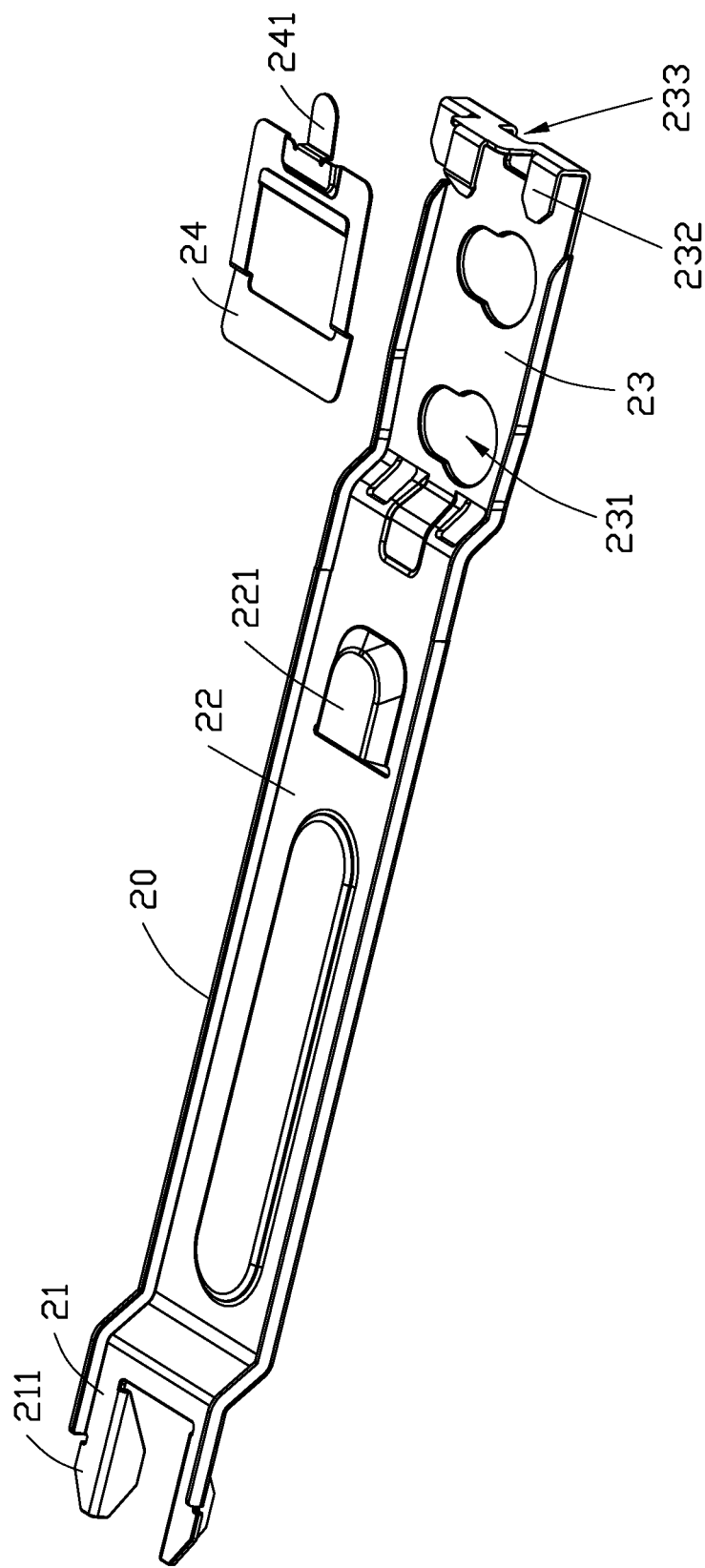
FIG. 2 is a schematic view of a fixing member of the bracket assembly of FIG. 1.

As illustrated in FIG. 2, the fixing member 20 includes a second plug-in portion 21, a buckling portion 22, and a holding portion 23. The second plug-in portion 21, the buckling portion 22, and the holding portion 23 are all plate-shaped and integrally formed. In this embodiment, the second plug-in portion 21, the buckling portion 22, and the holding portion 23 are connected in that order.

One end of the second plug-in portion 21 includes two third plug-in posts 211. The two third plug-in posts 211 protrude from the end of the second plug-in portion 21 away from the holding portion 23. The two third plug-in posts 211 cooperate with the two second plug-in posts 1121. Specifically, when the two third plug-in posts 211 are inserted into the notch 1124 formed by the two second plug-in posts 1121 and the bending portion 1122, the bending portion 1122 resists against the second plug-in portion 21, and then one end of the fixing member 20 is fixed to the fixing portion 112. In this embodiment, when the fixing member 20 is not positioned on the fixing portion 112, the two third plug-in posts 211 may also be inserted into the cabinet 400.

The buckling portion 22 is substantially strip-shaped. The buckling portion 22 is connected to an end of the second plug-in portion 21 away from the two third plug-in posts 211. The buckling portion 22 and the second plug-in portion 21 cooperatively form a stepped structure. One side of the buckling portion 22 away from the two third plug-in posts 211 defines a buckling hole 221. In this embodiment, the buckling hole 221 is recessed on a surface of the buckling portion 22 adjacent to the fixing portion 112 and along a side away from the fixing portion 112. The buckling hole 221 matches with the latching portion 1123. For example, by snapping the latching portion 1123 into the buckling hole 221, the fixing member 20 is detachably connected to the fixing portion 112.

The holding portion 23 is positioned at an end of the buckling portion 22 away from the second plug-in portion 21. The holding portion 23 forms a substantially stepped structure with the buckling portion 22. The holding portion 23 defines two mounting holes 231. The two mounting holes 231 may be substantially pear-shaped. The two mounting holes 231 cooperates with a bolt (not shown) on the PDU 300 so that the PDU 300 is mounted on the fixing member 20.

In this embodiment, the holding portion 23 further includes a third plug-in portion 232. The third plug-in portion 232 is positioned at an end of the holding portion 23 away from the buckling portion 22. In this embodiment, the third plug-in portion 232 is substantially a hook-shaped structure. The third plug-in portion 232 protrudes from the holding portion 23 and extends in a direction away from the fixing portion 112. A hook portion of the third plug-in portion 232 is positioned towards the buckling portion 22. The third plug-in portion 232 can be plugged into the cabinet 400.

In this embodiment, the holding portion 23 further defines a holding hole 233. The holding hole 233 is defined at a bent location of the third plug-in portion 232.

In this embodiment, the fixing member 20 further includes an anti-dropout member 24. The anti-dropout member 24 is an elastic sheet structure. In this embodiment, the anti-dropout member 24 may be a metal sheet. One end of the anti-dropout member 24 is fixed on the holding portion 23. Another end of the anti-dropout member 24 forms an anti-dropout portion 241. The anti-dropout portion 241 is substantially a semi-circular shape. The anti-dropout portion 241 is configured to cooperate with the holding hole 233. For example, after inserting one end of the anti-dropout portion 241 into the holding hole 233, when the third plug-in portion 232 of the fixing member 20 is fastened to the cabinet 400, the anti-dropout member 24 locks the third plug-in portion 232 in place, thereby effectively preventing the third plug-in portion 232 from detaching from the cabinet 400.

Figure 8:
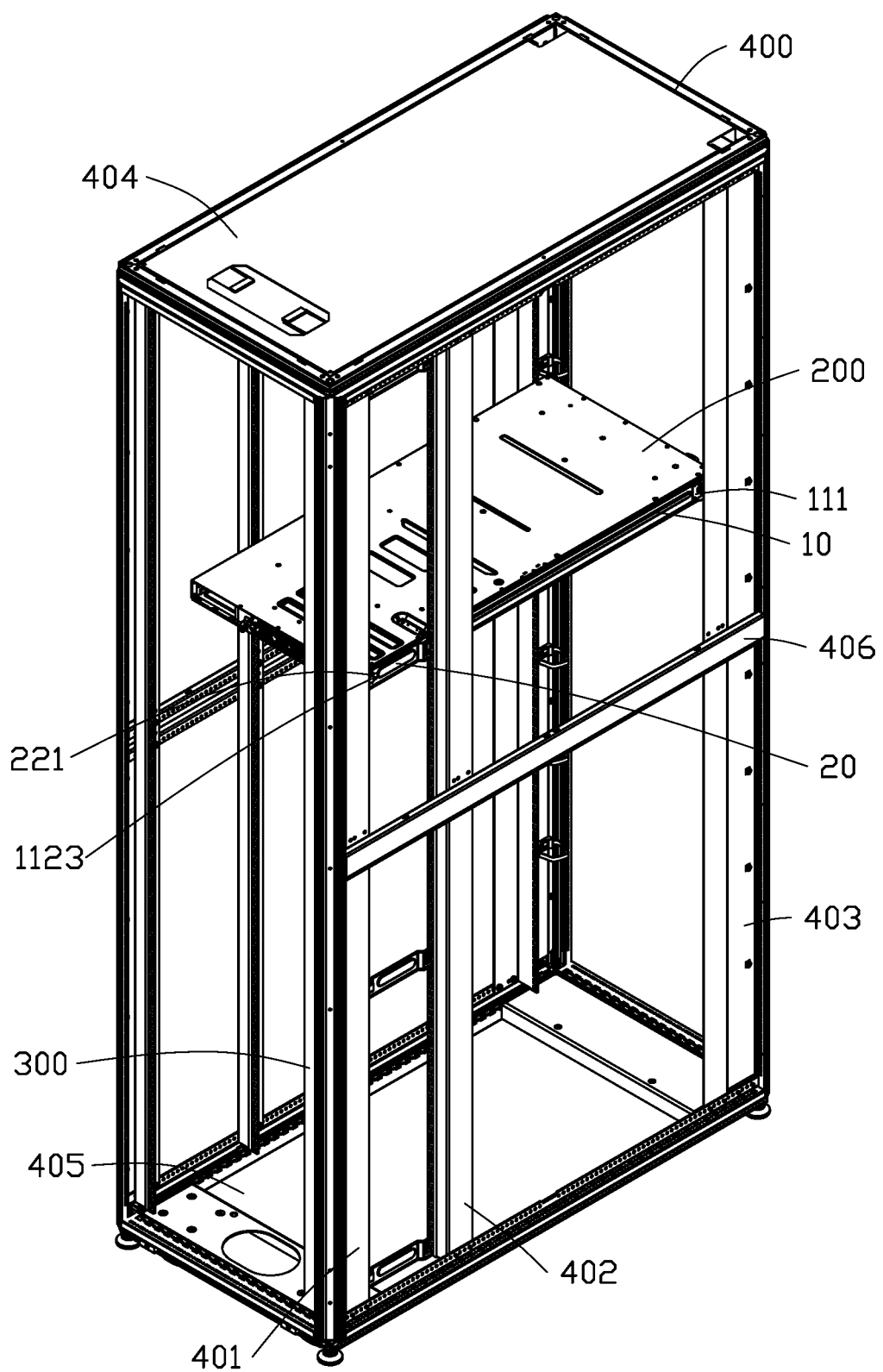
FIG. 8 is an isometric view showing the bracket assembly of FIG. 1 mounted on the cabinet.

As illustrated in FIG. 8, the cabinet 400 is substantially a rectangular frame structure. The cabinet 400 includes a group of first posts 401, a group of second posts 402, a group of third posts 403, an upper cover 404, a lower cover 405, and a group of horizontal posts 406. The first posts 401, the second posts 402, and the third posts 403 are all vertically arranged. Both ends of the first posts 401, the second posts 402, and the third posts 403 are fixed on the upper cover 404 and the lower cover 405, respectively.

The group of horizontal posts 406 are connected to the first posts 401, the second posts 402, and the third posts 403. The horizontal posts 406 are positioned in parallel with the upper cover 404 and the lower cover 405. The rectangular frame structure is formed by the first posts 401, the second posts 402, the third posts 403, the upper cover 404, the lower cover 405, and the horizontal posts 406. The cabinet 400 receives the PDU 300 and the server 200.

In this embodiment, the bracket assembly 100 can be disassembled as needed, and the PDU 300, the server 200, or both the PDU 300 and the server 200 can be selectively fixed.

Figure 5:
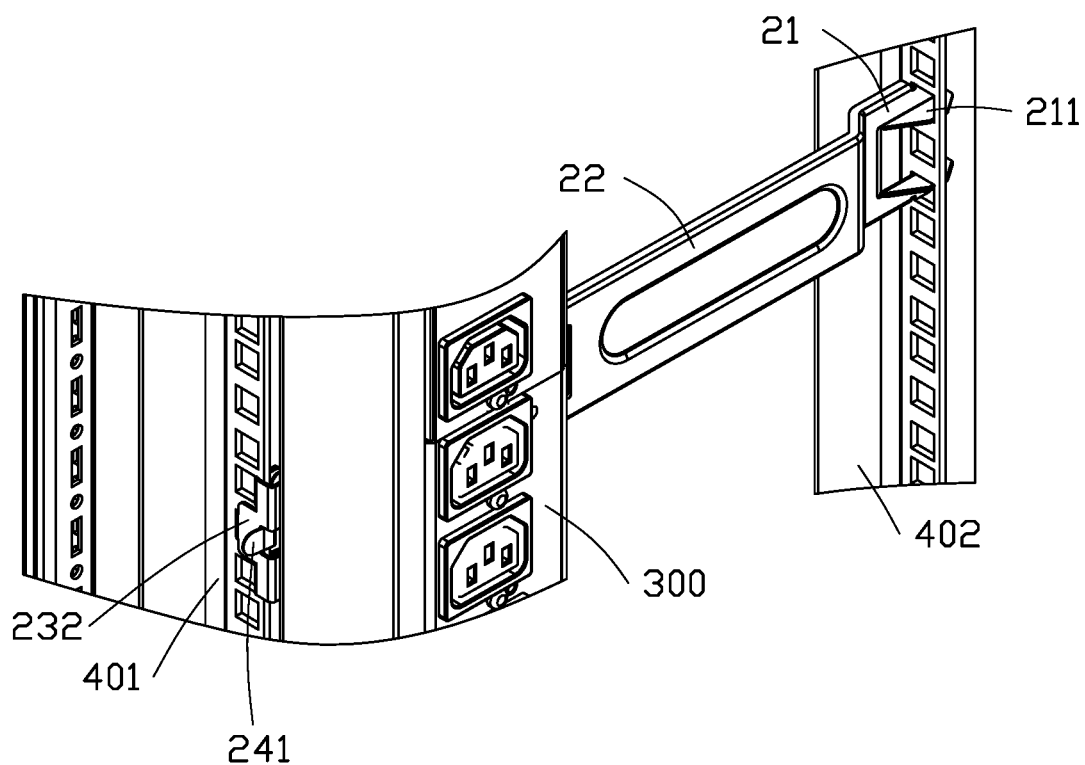
FIG. 5 is a schematic view showing the fixing member of the bracket assembly of FIG. 1 mounted on a cabinet.
Figure 6:
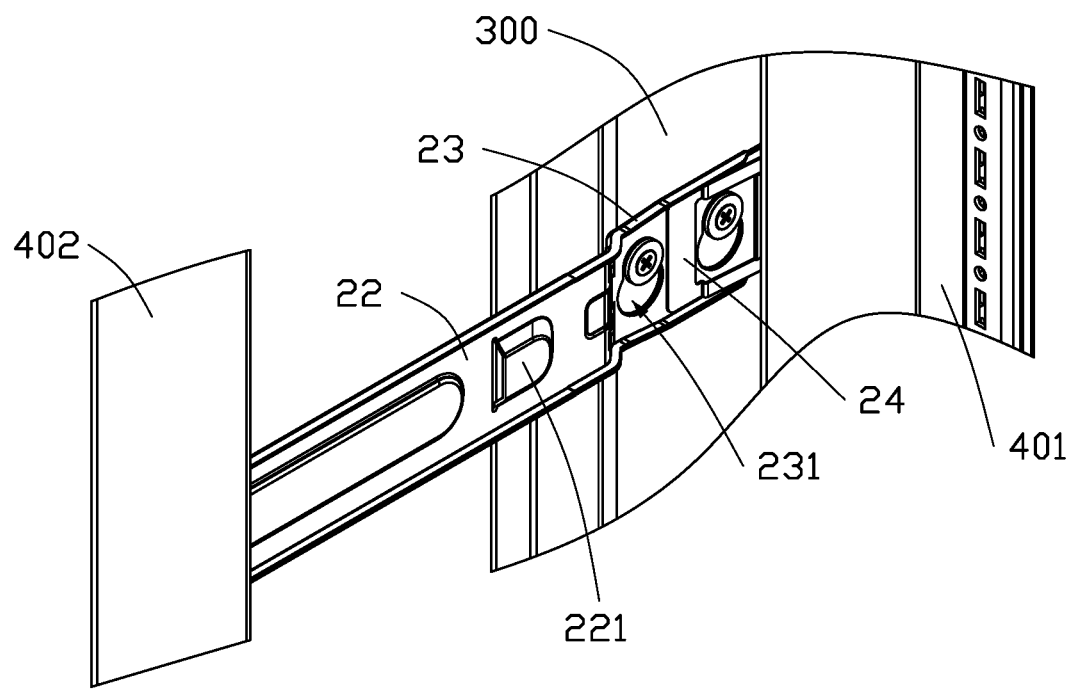
FIG. 6 is similar to FIG. 5, but shown from another angle.

For example, as illustrated in FIG. 5 and FIG. 6, when only the PDU 300 needs to be fixed on the cabinet 400, it is only necessary to install the fixing member 20 on the first posts 401 and the second posts 402 of the cabinet 400. Specifically, by inserting the third plug-in portion 232 of the fixing member 20 to the first post 401, then one end of the fixing member 20 is mounted on the cabinet 400. Then, the two third plug-in posts 211 of the fixing member 20 are inserted into the second post 402. For example, the two third plug-in posts 211 of the fixing member 20 are inserted into square holes of the second post 402, and then the other end of the fixing member 20 is mounted to the cabinet 400. Finally, the PDU 300 is fixedly mounted on the two mounting holes 231 of the fixing member 20 so that the fixing member 20 holds the PDU 300 (shown in FIG. 6).

In this embodiment, after the fixing member 20 is installed on the cabinet 400, because the anti-dropout member 24 is inserted into the holding hole 233, there is no space for the third plug-in portion 232 to move and so the fixing member 20 is held captive in the cabinet 400. When the anti-dropout member 24 is operated, the anti-dropout portion 241 of the anti-dropout member 24 stretches in a direction away from the third plug-in portion 232 and close to the buckling portion 22, the anti-dropout portion 241 disengages from the holding hole 233, so that the third plug-in portion 232 can be easily disengaged from the cabinet 400. That is, the fixing member 20 can be disengaged from the cabinet 400.

Figure 7:
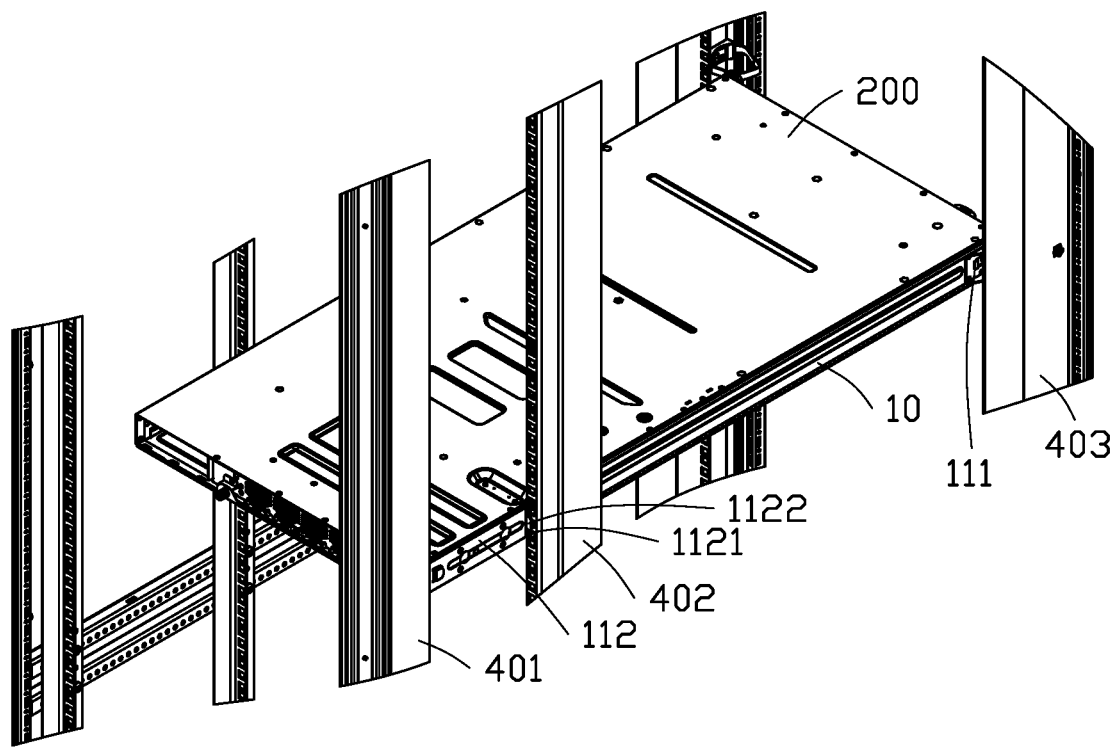
FIG. 7 is a schematic view showing a slide member of the bracket assembly of FIG. 1 mounted on the cabinet.

Referring to FIG. 7, when the cabinet 400 only needs to support the server 200, only the slide member 10 needs to be installed on the second post 402 and the third post 403 of the cabinet 400. Specifically, the two first plug-in posts 1111 at one end of the slide member 10 are connected to the third post 403, and then one end of the slide member 10 is installed on the cabinet 400. Next, the two second plug-in posts 1121 on the fixing portion 112 are inserted into the second post 402, and then the other end of the slide member 10 is fixed on the cabinet 400. The server 200 is fixed on the slide member 10 by snapping a hook of the server 200 into the latching hole 131 on the second sliding portion 13, so that the slide member 10 supports the server 200.

In addition, the second sliding portion 13 connected to the server 200 can be pulled, so that the second sliding portion 13 can slide relative to the first sliding portion 12 and the mounting portion 11, thereby extending a length of the slide member 10 to facilitate pulling out the server 200. For example, the server 200 can be pulled out to check its performance or be replaced by a new server. Similarly, after the inspection is completed or the server is replaced with a new one, the second sliding portion 13 may be pushed, the second sliding portion 13 and the first sliding portion 12 slide relative to the mounting portion 11, thereby reducing the length of the slide member 10, and driving the server 200 to be installed in the cabinet 400.

Figure 3:
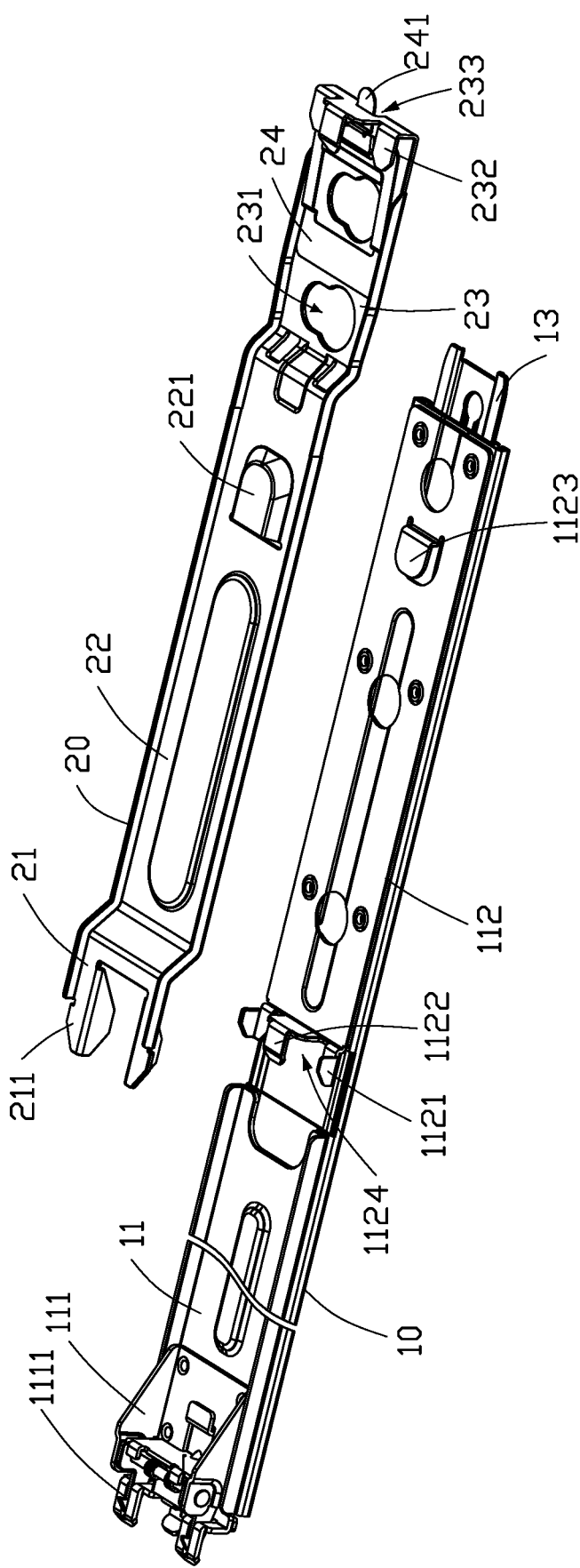
FIG. 3 is a partial, isometric view of an assembled bracket assembly of FIG. 1.
Figure 4:
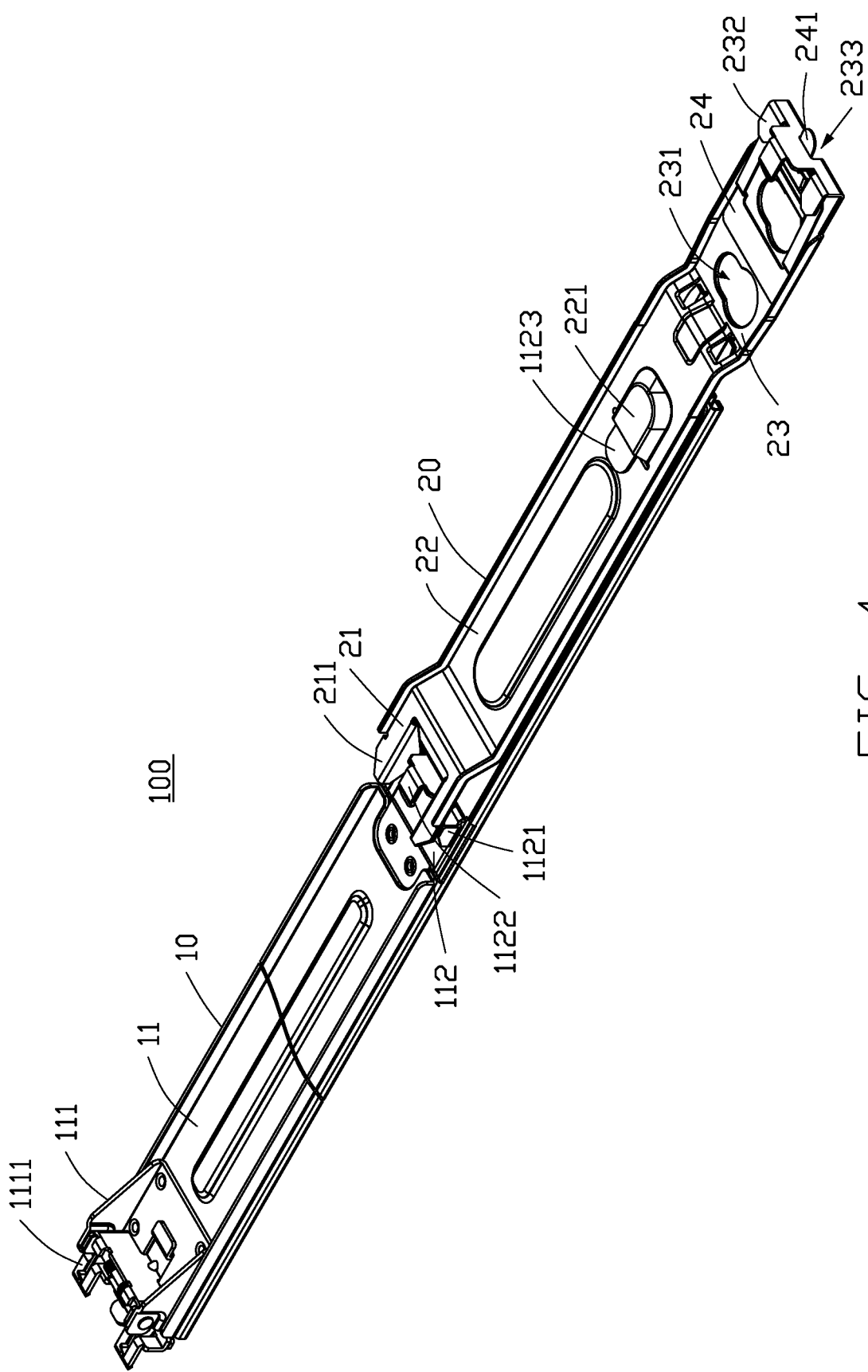
FIG. 4 is an isometric view of the assembled bracket assembly of FIG. 1.

As illustrated in FIG. 8, when the cabinet 400 needs to support the server 200 and fix the PDU 300 at the same time, it is only necessary to install the bracket assembly 100 to the first post 401, the second post 402, and the third post 403 of the cabinet 400. Firstly, as illustrated in FIG. 3 and FIG. 4, the fixing member 20 is assembled on the fixing portion 112 through the latching portion 1123 being latched into the buckling hole 221. Next, one end of the slide member 10 is installed on the cabinet 400 through the two first plug-in posts 1111 on one end of the slide member 10 being connected to the third post 403.

The third plug-in portion 232 of the fixing member 20 is fastened to the first post 401 to mount one end of the fixing member 20 to the cabinet 400. Then, the two third plug-in posts 211 of the fixing member 20 are inserted into the second post 402, for example, the other end of the fixing member 20 is mounted to the cabinet 400 by inserting the two third plug-in posts 211 of the fixing member 20 into the second post 402. Then, the PDU 300 is fixedly mounted on the two mounting holes 231 on the fixing member 20 so that the fixing member 20 holds the PDU 300. The hook on the server 200 is inserted into the latching hole 131 on the second sliding portion 13, so that the server 200 is fixed on and supported by the slide member 10.

In other embodiments, the server 200 may also be positioned on the second sliding portion 13 through other holding structures, and is not limited to being positioned on the second sliding portion 13 through the latching hole 131.

In other embodiments, the latching portion 1123 and the buckling hole 221 can be omitted, and the fixing member 20 may be detachably positioned on the slide member 10 by other methods.

The bracket assembly 100 is provided with the slide member 10 and the fixing member 20. The fixing member 20 is detachably mounted on the slide member 10. Therefore, the bracket assembly 100 can be combined for specific situations. For example, only using the slide member 10 to support the server 200, or only using the fixing member 20 to fix the PDU 300, or clamping the fixing member 20 to the slide member 10 to make the bracket assembly 100 hold the PDU 300 and support the server 200 at the same time. Therefore, the bracket assembly 100 is practical and an appropriate combination can be selected according to an actual situation. In this way, the slide member 10 and the fixing member 20 can be fully utilized without causing redundancy.

It is believed that the embodiments and their advantages will be understood from the foregoing description, and it will be apparent that various changes may be made thereto without departing from the scope of the disclosure or sacrificing all of its advantages, the examples hereinbefore described merely being illustrative embodiments of the disclosure.

What is claimed is:

1. A bracket assembly comprising:
a slide member, one end of the slide member configured to be mounted to a cabinet for supporting a server; and
a fixing member detachably positioned at the other end of the slide member;
wherein the other end of the slide member is mounted to the cabinet through the fixing member, and the fixing member is further configured to fix a power distribution unit;
wherein the slide member comprises a mounting portion, one end of the mounting portion comprises a fixing portion, the fixing portion comprises two second plug-in posts;
wherein the fixing portion further comprises a bending portion, the bending portion is positioned between the two second plug-in posts, the fixing member is positioned at the fixing portion, and comprises a second plug-in portion, one end of the second plug-in portion comprises two third plug-in posts; wherein the two third plug-in posts are inserted into a notch formed by the two second plug-in posts and the bending portion, the bending portion resists against the second plug-in portion.

2. The bracket assembly of claim 1, wherein a first sliding portion, and a second sliding portion, one side of the mounting portion is installed on the cabinet, the first sliding portion is slidably positioned at the other side of the mounting portion, the second sliding portion is slidably positioned at one side of the first sliding portion away from the mounting portion and supports the server.

3. The bracket assembly of claim 2, wherein another end of the mounting portion comprises a first plug-in portion, the first plug-in portion comprises two first plug-in posts; wherein the two first plug-in posts protrude at one end of the first plug-in portion, are spaced apart from each other, and are configured to be plugged into the cabinet.

4. The bracket assembly of claim 3, wherein the two second plug-in posts are spaced apart from each other, protrude from one end of the fixing portion, and are configured to be plugged into the cabinet.

5. The bracket assembly of claim 4,
wherein the two third plug-in posts are further configured to be plugged into the cabinet when the fixing member is not positioned on the fixing portion.

6. The bracket assembly of claim 5, wherein the fixing member further comprises a holding portion, the holding portion is positioned away from the second plug-in portion and defines mounting holes, the power distribution unit is mounted to the fixing member through the mounting holes.

7. The bracket assembly of claim 6, wherein the holding portion further comprises a third plug-in portion, the third plug-in portion protrudes from the holding portion and extends in a direction away from the fixing portion, the third plug-in portion is configured to be plugged in the cabinet.

8. The bracket assembly of claim 7, further comprising an anti-dropout member, wherein the anti-dropout member is positioned at the holding portion for preventing the third plug-in portion from detaching from the cabinet.

9. A bracket assembly comprising:
a fixing member comprising:
a second plug-in portion; and
a holding portion connected to the second plug-in portion and configured to support a power distribution unit;
wherein one end of the fixing member is mounted to a cabinet through the second plug-in portion, and the other end of the fixing member is mounted to the cabinet through the holding portion;

wherein the bracket assembly further comprises a slide member, the slide member comprises a mounting portion, one end of the mounting portion comprises a fixing portion, the fixing portion comprises two second plug-in posts; and wherein the fixing portion further comprises a bending portion, the bending portion is positioned between the two second plug-in posts, the fixing member is positioned at the fixing portion, and comprises a second plug-in portion, one end of the second plug-in portion comprises two third plug-in posts; wherein the two third plug-in posts are inserted into a notch formed by the two second plug-in posts and the bending portion, the bending portion resists against the second plug-in portion.

10. The bracket assembly of claim 9, wherein one end of the second plug-in portion comprises two third plug-in posts, the two third plug-in posts protrude from the end of the second plug-in portion away from the holding portion and are configured to be inserted into the cabinet.

11. The bracket assembly of claim 9, wherein the holding portion defines mounting holes, the power distribution unit is mounted to the fixing member through the mounting holes.

12. The bracket assembly of claim 9, wherein the holding portion further comprises a third plug-in portion, the third plug-in portion protrudes from the holding portion and is configured to be plugged in the cabinet.

13. The bracket assembly of claim 12, further comprising an anti-dropout member, wherein the anti-dropout member is positioned at the holding portion for preventing the third plug-in portion from detaching from the cabinet.

* * * * *